United States Patent [19]

Kausche et al.

[11] 4,302,737

[45] Nov. 24, 1981

[54] RC NETWORK

[75] Inventors: Helmold Kausche, Munich; Heinz Hebbeker, Steingaden, both of Fed. Rep. of Germany

[73] Assignee: Siemens Aktiengesellschaft, Berlin & Munich, Fed. Rep. of Germany

[21] Appl. No.: 105,946

[22] Filed: Dec. 20, 1979

[30] Foreign Application Priority Data

Jan. 26, 1979 [DE] Fed. Rep. of Germany ....... 2903025

[51] Int. Cl.³ .................. H03H 1/02; H03H 3/00; H03H 7/01
[52] U.S. Cl. .................... 333/172; 29/610 R; 29/620; 333/184; 333/185
[58] Field of Search ............. 333/167, 172, 181–185; 361/271–273, 275, 277, 278, 292, 330, 322, 321, 301–307; 29/610 R, 620, 621; 338/282, 292–293

[56] References Cited

U.S. PATENT DOCUMENTS

| 3,542,654 | 11/1970 | Orr | 333/172 X |
| 3,660,158 | 5/1972 | Chen et al. | 29/620 X |
| 3,857,074 | 12/1974 | Heywang et al. | 361/273 X |
| 4,095,199 | 6/1978 | Behn et al. | 333/167 |
| 4,176,445 | 12/1979 | Solow | 29/620 |
| 4,217,570 | 8/1980 | Holmes | 29/620 X |

Primary Examiner—Marvin L. Nussbaum
Attorney, Agent, or Firm—Hill, Van Santen, Steadman, Chiara & Simpson

[57] ABSTRACT

An RC network is disclosed in which two electrically conducting regions and a dielectric lying between these regions form a capacitor. At least one of the electrically conducting regions consists of resistance material and is designed in the shape of a meandering path. This network can be balanced while still guaranteeing a uniform region distribution of the resistance and the capacitance, by means of a laser beam. Upon a carrier of heat-resistant material, a resistance layer, a dielectric of glow discharge polymer, and an opposite electrode capable of regeneration, are applied. The dielectric completely covers the resistance layer with the exception of contact pads.

9 Claims, 1 Drawing Figure

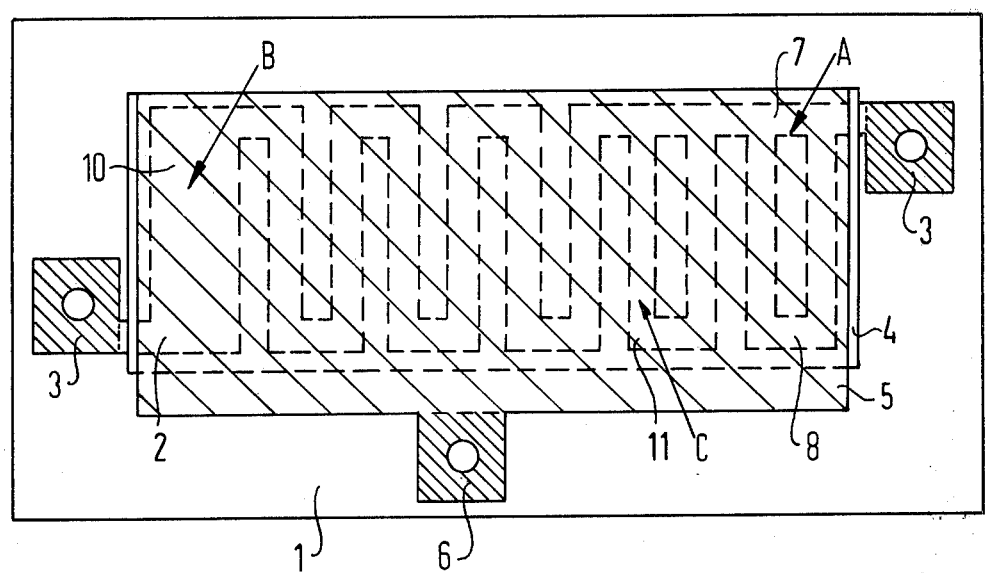

RC NETWORK

BACKGROUND OF THE INVENTION

The present invention concerns an RC network wherein two electrically conducting regions and a dielectric which lies between these regions form a capacitor. At least one of the electrically conducting regions consists of resistor material and is formed in a wandering or meandering-shaped path. The resistance which is so formed can be balanced or equalized depending upon the construction of an electrical circuit.

SUMMARY OF THE INVENTION

It is an object of the present invention to provide a construction which permits an operational balancing or equalizing and that a uniform surface distribution of capacitance and resistance can be guaranteed.

This problem is solved in that upon a carrier of heat-resistant material, a resistance layer, a dielectric layer of glow discharge polymer, and a rear or opposite electrode which is oxidizable in regeneration processes are applied, and that the dielectric and the opposite electrode completely covers the resistance layer with the exception of contact areas or pads, so that a capacitor which is capable of regeneration arises.

This construction has the advantage that a uniform surface distribution of the resistance and capacitance is guaranteed, since the resistance layer is completely covered by the opposite electrode of the capacitance. By means of the use of a thin capacitor coating which is capable of regeneration and of a dielectric of a glow discharge polymer, it is possible to balance the resistance by means of a laser beam or by means of a corpuscular beam, wherein the resistance layer, the dielectric layer, and the opposite or rear electrode are removed together, while the carrier remains undamaged. Therefore, because of the capacity for regeneration, no short circuit arises between the resistance and the opposite coating. The glow discharge polymer layers in particular contribute significantly to the ability to regenerate. The balancing or equalizing does not lead to any loss of quality in the case of the embodiment specified, as would be the case for example, where an entire surface of a tantalum or tantalum nitrite resistance layer lying on top is removed by means of anodic forming. Also, the method of German Offenlegungsschrift No. 2,556,696 incorporated herein by reference, which uses a base electrode which can be oxidized anodically, for example, such as tantalum or tantalum alloy, does not permit a fine equalizing or performance equalizing without a disruption of the uniform surface distribution. There, an oxide layer which is controllably grown, is employed as a dielectric. Resistance bridges which project laterally under the opposite electrode are employed for the fine balancing through laser cutting and also for the operational balancing. By means of the laser cutting, the resistance value in the resistance bridges or paths is raised. This method according to the state of the art thus causes an incomplete covering of the resistance layer by the opposite electrode, whereby this deviation from the complete covering is also not constant and thus cannot be calculated. Also, distributed RC lines cannot be fully realized with it.

For rough calculation, it is advantageous if closed loop conducting paths are formed on the resistance layer. By these loops the resistance can be raised. A balancing or equalization by means of laser beams can be advantageously realized where the carrier consists of polyimide. Upon this carrier a resistor layer of, for example, chrome nickel, is first applied. Then a glow discharge polymer layer and finally a metal layer, for example, of aluminum, is provided as a rear or opposing electrode. The polyimide has a sufficient temperature-resistant characteristic and is permeable for the laser light in particular from YAG lasers (Ruby lasers). Therefore, it is advantageous that corresponding regions of the resistance layer, of the dielectric, and of the rear electrode are removed together by means of a YAG laser (Ruby laser). This can proceed both through the polyimide films as well as from the metal layer. This is advantageous in particular for operational balancing, since, after the insertion into a circuit, under some circumstances each side of the RC network is no longer easily reachable for a laser beam.

In order to be able to equalize a relatively large variance of the electrical values, or respectively, of the production tolerances, without having to use an overly great expenditure of material, it is advantageous that for reducing the product RC, a region in the closed loop conducting paths is removed or severed and which indeed is capacitively active, but not traversed by the main current. The main current flows in the closed conducting paths essentially along the shortest path. On the longer path it flows only to a reduced degree corresponding to the larger electrical resistance. If material is removed from the conducting paths along the longer path, then the main current hardly changes. However, the region which functions as a capacitor coating does change. The current through the shortest path of the closed conducting paths is designated as a main current.

For raising of the resistance at random locations, parts of the resistance layer which are traversed by the current are destroyed. In the case of branched currents, the wider the resistance layer is at the corresponding location and the smaller the current is through the current path which has been reduced in size, the finer is the resistance equalization. In the case of the construction according to the invention, each location of the resistance layer which is reachable by a laser is essentially suited for the equalization balancing. Besides raising the RC product, also a decrease of the RC product is possible without destruction of the RC element.

BRIEF DESCRIPTION OF THE DRAWING

The drawing FIGURE shows an RC network according to the invention, where the opposite coating which lies on top in the drawing is cross-hatched in coarse fashion, and the contact areas are represented in fine cross-hatching.

DESCRIPTION OF THE PREFERRED EMBODIMENTS

Upon a carrier film 1, a resistance layer 2 is applied which is in the shape of a meandering or winding path. This is connected with electrically conducting contact areas or pads 3. Upon the resistance layer 2 a polymer layer 4 is applied which completely covers the resistance layer 2. However, this layer 4 leaves the contact pads 3 free. Onto this glow discharge polymer layer 4 a metal layer 5 is applied as a rear or opposite electrode. This is electrically connected with a contact pad 6, preferably all in one piece. The metal layer 5 is advantageously comprised of a thin aluminum layer.

By means of a laser beam in arrow direction A, a rough equalization or trimming can proceed, wherein the short path or web 7 is cut so that the current must flow over the longer path 8. By means of a laser beam in the arrow direction B, a fine balancing or trimming can be effected. The laser beam in arrow direction B strikes a relatively wide region 10, so that a very fine balancing of the resistance is possible. By means of a laser beam in arrow direction C, a part of a closed loop 11 of the resistance path 2, which part is not traversed by the main current, can be severed or reduced in size. Accordingly, a reduction in size of the capacitance is possible with a resistance value which almost remains the same and thus a reduction in size of the RC product is possible.

In the case of the adjustments by means of laser equalization which are discussed above, a uniform surface distribution of R and C is maintained.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A distributed RC network, comprising: two electrically conducting regions and a dielectric between the conducting regions so as to form a capacitor; at least one of the electrically conducting regions comprising a resistance layer which has a meandering path shape and at least one closed loop connecting to the path; a carrier of heat-resistant material and the resistance layer being formed on the carrier; said dielectric comprising a glow discharge polymer over the resistance layer; the other electrical conducting region comprising an opposite electrode of a metal which can be oxidized in occurring regeneration processes being applied over the dielectric; and the dielectric and the opposite electrode completely covering the resistance layer except for contact areas; whereby an RC network is provided having a capacitance which is capable of regeneration.

2. An RC network according to claim 1 wherein the resistance layer path shape has a portion which is substantially wider than other portions of the path.

3. An RC network according to claim 1 wherein the carrier comprises polyimide, the resistance layer comprises chrome nickel, and the opposite electrode comprises aluminum.

4. A distributed RC network designed for trimming by cutting away conducting layers forming the network, comprising: an insulating heat-resistant carrier; a resistance layer on the carrier formed of a winding main resistance path and at least one closed loop secondary path connecting to and adjacent the main path; a dielectric covering substantially covering the resistance layer and an oxidizable opposite electrode conducting layer over substantially all of the dielectric so as to form a regenerable capacitor with the resistance layer and the dielectric therebetween.

5. The network of claim 4 wherein the carrier comprises polyimide, the dielectric comprises a gas discharge polymer, and the opposite electrode comprises aluminum.

6. The network of claim 4 wherein a portion of the main resistance path is substantially wider than other portions.

7. A method for trimming a distributed RC network formed of a heat resistant carrier, a resistance layer on the carrier having a meandering resistance path, a dielectric over the resistance path, and an opposite electrode over the dielectric which forms in conjunction with the dielectric and resistance layer a regenerable capacitor, comprising the steps of: cutting away with a laser a portion of the resistance layer path the dielectric, and the opposite electrode but without substantially changing the carrier, and such that after the portion of the resistance layer is cut away the capacitor regenerates when voltage is applied to eliminate short circuits from between the opposite conducting layer and resistance path.

8. A method according to claim 7 including the steps of providing the resistance path with a connecting closed loop secondary resistance path extending from and bridging a main portion of the resistance path; cutting through the main path portion to effect a substantial resistance change without substantially changing capacitance; and trimming the secondary closed path in order to effect a change of capacitance without substantially changing resistance of the network.

9. The method of claim 7 including the step of providing a portion of the resistance path wider than other portions and trimming away portions of the wider resistance layer for a fine resistance adjustment without substantially effecting capacitance.

* * * * *